United States Patent [19]

Echizen et al.

[11] Patent Number: 5,010,276
[45] Date of Patent: Apr. 23, 1991

[54] MICROWAVE PLASMA CVD APPARATUS WITH PLASMA GENERATING CHAMBER CONSTITUTING A CYLINDRICAL CAVITY RESONATOR

[75] Inventors: Hiroshi Echizen, Tokyo; Satoshi Takaki, Yokohama, both of Japan

[73] Assignee: Canon Kabushiki Kaisha, Tokyo, Japan

[21] Appl. No.: 252,646

[22] Filed: Oct. 3, 1988

[30] Foreign Application Priority Data

Oct. 9, 1987 [JP] Japan .............................. 62-256030
Oct. 9, 1987 [JP] Japan .............................. 62-256031

[51] Int. Cl.$^5$ .............................................. H01J 7/24
[52] U.S. Cl. ............................ 315/111.21; 315/111.91; 427/38
[58] Field of Search .................... 315/111.21, 111.31, 315/111.41, 111.51, 111.61, 111.71, 111.81, 111.91; 313/231.31, 231.41, 231.51, 231.61; 437/101; 427/38

[56] References Cited

U.S. PATENT DOCUMENTS 4,908,329  3/1990  Kanai et al. .................... 437/101

Primary Examiner—Eugene R. LaRoche
Assistant Examiner—Ali Neyzari
Attorney, Agent, or Firm—Fitzpatrick, Cella Harper & Scinto

[57] ABSTRACT

A microwave plasma CVD apparatus which comprises a treating chamber having means for supporting a body to be treated therein, a plasma generating chamber connected to the treating chamber through a metal mesh, means for introducing a gas into the plasma generating chamber, and means for introducing microwave to convert the gas into a plasma. An embodiment thereof is characterized in that an oscillator for the microwave performs continuous oscillation, the plasma generating chamber constitutes a cylindrical cavity resonator surrounded by the metal mesh and a stop or stops, and a bell-jar smaller than the cavity in length and much smaller than the cavity in inside diameter is disposed in the cavity resonator in contact with the metal mesh to constitute a reentrant cylindrical cavity resonator through control of the position of the stop and the open area ratio of the aperture of the stop. The other embodiment is characterized in that an oscillator for the microwaves performs continuous oscillation, the plasma generating chamber constitutes a cavity surrounded by the mesh and a stop or stops, a bell-jar internally contacting the cavity is disposed in contact with the mesh, and the position of the stop and the open area ratio of the aperture of the stop are controllable according to the condition of electric discharge generated in the bell-jar, whereby the cavity resonator formed before the electric discharge and the cavity resonator formed after the discharge are formed at different positions.

8 Claims, 8 Drawing Sheets

MICROWAVE PLASMA CVD APPARATUS WITH PLASMA GENERATING CHAMBER CONSTITUTING A CYLINDRICAL CAVITY RESONATOR

FIELD OF THE INVENTION

This invention relates to an improved microwave plasma CVD apparatus which is suitable for the formation of a deposited film. More particularly, it relates to an improved microwave plasma CVD apparatus capable of effectively matching input impedance before and after formation of a plasma without effecting ECR and conducting stable electric discharge.

BACKGROUND OF THE INVENTION

A plasma CVD process means a process for forming a deposited film on a substrate by converting a specified substance into a plasma to form highly active radicals and bringing the radicals into contact with the substrate, and a plasma CVD apparatus means an apparatus used for carrying out the plasma CVD process.

Hitherto, such a plasma CVD apparatus has comprised a plasma CVD chamber constituted of a vacuum vessel provided with a raw material gas inlet port and an exhaust port, and a device for supplying electromagnetic waves or the like for supplying the energy by which the raw material gas introduced into the plasma CVD chamber is converted into a plasma.

The plasma CVD process is based on the high activity of the radicals mentioned above, and a desired deposited film is formed by appropriately selecting the density of the radicals, the temperature of the body to be treated, and the like. An important factor in the plasma CVD process is to efficiently form desired radicals to bring about the formation of a deposited film.

As a medium for supplying the energy for generating a plasma, electromagnetic waves of a high frequency of about 13.56 MHz have conventionally been used. However, it has recently been found that by the use of microwave of a frequency of about 2.45 GHz, it is possible to efficiently form a high-density plasma and to concurrently heat the body to be treated. And the public attention has been focused on a plasma CVD process employing microwave, and along with this, several apparatuses for the process have been proposed.

For instance, there have been proposed a method of forming a deposited film of amorphous silicon (hereinafter referred to as "A-Si") as a component for use in semiconductor devices, electrophotographic photosensitive materials, image inputting sensors, image pickup devices, photovoltaic devices and other electronic devices, optical devices, etc. by the plasma CVD process employing microwave (hereinafter referred to as "MW-PCVD process"), and an apparatus for carrying out the method.

FIG. 9 is a sectional schematic view illustrating an example of such known MW-PCVD apparatus.

In FIG. 9, numeral 1 denotes a rectangular waveguide, 2 a microwave inlet window, 3 a plasma generating chamber, 4 a film forming chamber, 5 and 10 each a gas supply pipe, 6 an exhaust port, 7 a body to be treated, 8 a support for the body to be treated, and 9 denotes a metal mesh.

As shown in FIG. 9, the apparatus comprises the chamber 3 for generating a plasma by use of microwave and the chamber 4 for forming a film by the plasma, the plasma generating chamber 3 and the film forming chamber 4 being separated by the metal mesh 9 so as to prevent the microwave and charged particles from penetrating into the film forming chamber 4. The plasma generating chamber 3 is constructed as a cavity resonator, and the microwave propagated through the rectangular waveguide 1 are introduced into the chamber 3 through the microwave inlet window 2 made of a dielectric material such as quartz ($SiO_2$), alumina ceramic ($Al_2O_3$) and Teflon. The film forming chamber 4, in which the body to be treated 7 is disposed, is provided with the gas supply pipe 5 and the exhaust port 6 for evacuating the plasma generating chamber 3 and the film forming chamber 4.

When the MW-PCVD apparatus of the above construction is operated, microwaves are introduced through the rectangular waveguide 1 into the plasma generating chamber 3, and an electric discharged gas introduced through the gas inlet port 10 is converted into a plasma by the electric field energy of the microwave to form a multiplicity of radicals. Only the radical capable of penetrating through the metal mesh 9 are introduced into the film forming chamber 4, to collide with the gas supplied through the gas supply pipe 5, whereby it is possible to form a deposited film on the body to be treated 7.

In the use of the conventional MW-PCVD apparatus of the above-mentioned construction, however, there is an unsolved problem that when the rectangular waveguide 1 and the plasma generating chamber 3 constituting the cavity resonator are fastened to each other, input impedance matching is not achieved and, therefore, a major portion of the electric field energy of the microwave is reflected, hindering effective utilization of the energy.

As a method of solving the problem, a method has been employed in which electromagnets are disposed around the cavity resonator to effect ECR (electron cyclotron resonance) (Refer to Japanese Patent Application Laid-Open No. 55-141729 (1980)). The method, however, requires a magnetic flux density of 875 gauss, leading to a considerably large and heavy apparatus. In addition, since the apparatus is generally designed to have a cavity resonator in vacuum, the refractive index of the plasma generated by electric discharge becomes less than 1, resulting in that the cavity resonator does no longer exist (Refer to "Electric Discharge Handbook" complied by The Institute of Electrical Engineers of Japan, Part 4, Chapter 2, P.298). Further, in the case where a static magnetic field is developed by electromagnets, the current is varied by heating the coiled wire material and, therefore, it takes a long period of time to stably establish the ECR condition (namely, a magnetic flux density of 875 gauss) by controlling the current variation. Besides, a deviation from the ECR condition during the period causes a lowering in the microwave absorption coefficient, and it is difficult to raise the efficiency in using the electric field energy before the condition is stabilized.

SUMMARY OF THE INVENTION

It is an object of this invention to provide an improved MW-PCVD apparatus which overcomes the above-mentioned problems associated with the conventional MW-PCVD apparatuses and makes it possible to raise the efficiency in using the electric field energy of microwave and perform efficient formation of a deposited film.

Namely, the object of this invention is to provide an improved MW-PCVD apparatus capable of conducting stable electric discharge through effectively matching input impedance both before and after formation of a plasma, without effecting ECR.

The present inventors have made intensive studies for solving the above-mentioned problems associated with the conventional MW-PCVD apparatuses and for attaining the above-mentioned object of this invention. As a result of the studies, it was discovered that when a cavity resonator before the formation of a plasma and the cavity resonator after the plasma formation are of different types, input impedance matching is attainable both before and after the plasma formation and stable electric discharge is achievable. It was also found out that when the cavity resonator before electric discharge and the cavity resonator after the electric discharge are formed at different positions, it is possible to eliminate the effect of the refractive index of the plasma and to achieve impedance matching both before and after electric discharge.

The MW-PCVD apparatus according to this invention has been completed as a result of further investigations made based on the above findings. In a first aspect of this invention, there is provided (1) a MW-PCVD apparatus comprising a treating chamber having means for supporting a body to be treated therein, a plasma generating chamber connected to the treating chamber through a metal mesh, means for introducing a gas into the plasma generating chamber, and means for introducing microwave to convert the gas in the plasma generating chamber into a plasma, wherein an oscillator for the microwave performs continuous oscillation, the plasma generating chamber constitutes a cylindrical cavity resonator surrounded by the metal mesh and a stop or stops, and a bell-jar smaller than the cavity in length and much smaller than the cavity in inside diameter is disposed in the cylindrical cavity resonator in contact with the metal mesh, thereby constituting a reentranat cylindrical cavity resonator through generation of electric discharge in the bell-jar. In a second aspect of this invention, there is provided (2) a MW-PCVD apparatus comprising a treating chamber having means for supporting a body to be treated therein, a plasma generating chamber connected to the treating chamber through a metal mesh, means for introducing a gas in the plasma generating chamber, and means for introducing microwave to convert the gas in the plasma generating chamber into a plasma, wherein an oscillator for the microwave performs continuous oscillation, the plasma generating chamber constitutes a cavity surrounded by the metal mesh and a stop or stops, a bell-jar internally contacting the cavity is disposed in contact with the metal mesh, and the position of the stop and the open area ratio of the aperture of the stop are controllable according to the condition of electric discharge generated in the bell-jar.

The first MW-PCVD apparatus according to this invention, with the simple construction in which the stop and the bell-jar are disposed, provides different types of cavity resonators before and after the electric discharge. Therefore, stable discharge is attainable even at a plasma density not lower than the cut-off density, and a higher HF voltage is obtainable at a coaxial portion as compared in the case of an ordinary cylindrical type cavity resonator. Thus, there is obtained an effect of enhancing the film forming rate.

At the same time, since the first MW-PCVD apparatus of this invention does not employ a large electromagnet, there is obtained an effect of an easy enlargement of area.

The second MW-PCVD apparatus according to this invention, with different types of cavity resonators formed before and after electric discharge, makes it possible to achieve stable electric discharge even at a plasma density not lower than the cut-off density $(7.5 \times 10^{18}$ [cm$^{-3}$] at 2.45 GHz) and to maintain stable and efficient electric discharge even in the cavity resonator having such an inside diameter that microwave is cut off upon occurrence of electric discharge. Namely, the cavity resonator of this invention raises the upper limit of the pressure at which electric discharge is attainable, with a simple construction, or enables electric discharge even the restriction on the inside diameter of the cavity resonator is expanded; as a result, the degree of freedom in designing the apparatus is increased, and makes it possible to heighten the film forming rate and also to control of the quality of a resulting film as desired.

At the same time, since the second MW-PCVD apparatus of this invention does not employ a large electromagnet, there is obtained an effect on an easy enlargement of area.

BRIEF DESCRIPTION OF THE DRAWINGS

FIGS. 5 and 6 are each a partially sectional schematic illustration of one typical example of the second MW-PCVD apparatus according to this invention, in which FIG. 5 shows the condition before plasma generation, while FIG. 6 shows the condition after the plasma generation;

DETAILED DESCRIPTION OF THE INVENTION

This invention will now be described more in detail while referring to the following exemplary apparatuses, to which this invention is not limited.

APPARATUS EXAMPLE 1

Figure 1:
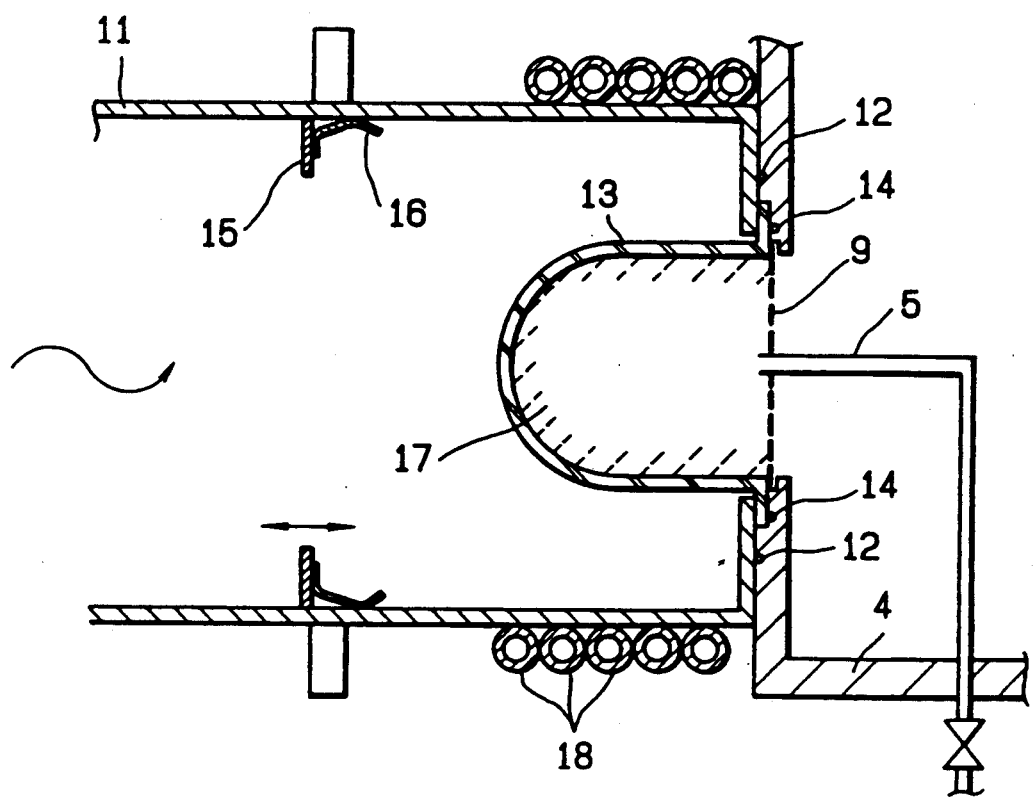
FIG. 1 is a partially sectional schematic illustration of one typical example of the first MW-PCVD apparatus according to this invention.
Figure 2:
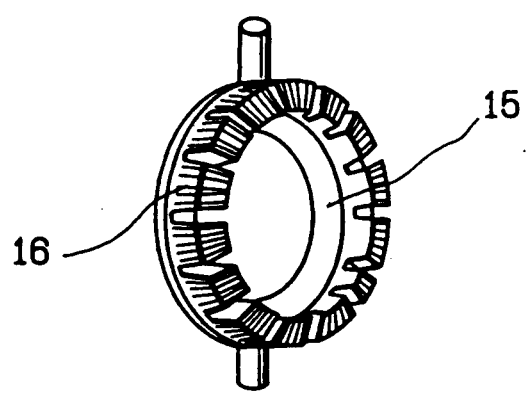
FIG. 2 is a perspective view of a circular stop used in the apparatus shown in FIG. 1.

FIG. 1 is a partially sectional schematic illustration of one typical example of the first MW-PCVD apparatus according to this invention, and FIG. 2 is a perspective view of a circular stop for use in the apparatus shown in FIG. 1.

In the figures, numeral 4 denotes a treating chamber, 5 a gas supply pipe, 9 a metal mesh (made of aluminum), 11 a circular waveguide (made of aluminum), 12 an E.M.I. (electromagnetic interference) shield ring (made of copper), 13 a bell-jar (made of quartz), 14 an Ô-ring, 15 a circular stop (made of aluminum), 16 a finger type E.M.I. shield member (made of copper), 17 a plasma, and 18 denotes a water-cooling pipe (made of copper).

As is apparent from FIG. 1, the circular waveguide 11 is fastened to the treating chamber, and the E.M.I. (electromagnetic interference) shield ring 12 is used for good electrical contact of the two members. The circular bell-jar 13 is fixed in the circular waveguide 11, and gas tightness is maintained by the Ô-ring 14. The circular bell-jar 13 and the treating chamber 14 are separated from each other by the metal mesh 9, the mesh opening area of which is so selected as to permit penetration of gases therethrough but not to permit transmission of microwave therethrough. The circular waveguide 11 is provided with two slits in the direction of weaker electric field so that the circular stop 15 in the waveguide 11 can be externally driven through the slits. To the circular stop 15, the finger type E.M.I. shield 16 is secured, as shown in FIG. 2, for good electrical contact of the stop 15 and the waveguide 11.

In operation, a microwave oscillator (not shown) is first started to cause microwave to be propagated through a microwave circuit (not shown), thereby effecting excitation in a $^0TE_{11m}$ mode (m is an integer). The microwave thus propagated is denoted by an arrow ∼in FIG. 1.

For easy start of electric discharge in FIG. 1, it is sufficient to satisfy the following conditions:

Condition 1: to use a circular waveguide 11 having such an inside diameter D that the microwave is not cut off;

Condition 2: to form a cavity resonator by the circular stop 15 and the metal mesh 9.

Condition 1 is satisfied, according to Eitaro Abe, "MICROWAVE GIJUTSU (Microwave Engineering)", The University of Tokyo Press, by satisfying the following formula (1):

$$D > \frac{1.841}{\pi} \times \lambda_0 \quad (1)$$

where $\lambda_0$ is the wavelength |mm| of microwave in free space.

Condition 2 is satisfied by inserting a commercial microwave wattmeter into the microwave circuit (not shown) between the microwave oscillator (not shown) and the circular waveguide 11 and adjusting the position of the circular stop 15 so that reflected power is substantially zero and transmitted power is maximized.

In general, the microwave of a frequency of 2.45 GHz are used, so that $\lambda_0 = 122.4$ [mm] and Condition 1 is D>71.7 [mm] from the formula (1). Based on experiments, condition 2 is as shown in Table 1.

The experiments were carried out under the conditions of a microwave power of 150 W and a pressure of 2 Torr by using 30 sccm of SiF$_4$ gas, 200 sccm of Ar gas and 20 sccm of H$_2$ gas.

Next, when electric discharge takes place in the bell-jar 13, the microwave are propagated between the bell-jar 13 and the circular waveguide 11 due to the conductivity of the plasma 17. As a result, the microwave guides energy to the plasma 17 by way of not only a front end portion but a side surface portion of the bell-jar 13, whereby the contact area of the microwave and the plasma can be increased. For maintaining the electric discharge efficiently, it is necessary to satisfy the following condition:

Condition 3: to control the position of the circular stop and the open area ratio of the aperture of the stop so as to constitute a reentrant cylindrical cavity resonator defined by the stop, circular waveguide and bell-jar.

The procedure of adjustments for Condition 3 is the same as that for Condition 2.

The position of the circular stop after the electric discharge depends on the phase delay $\lambda$ of the reflected wave of the microwave from the plasma, and $\lambda$ is heavily dependent on the discharge conditions (microwave power, the kinds of gases, pressure, etc.).

Namely, this system can be realized by satisfying Conditions 1 and 2 before electric discharge and satisfying Condition 3 after the electric discharge. However, impedance matching before and after the electric discharge requires an adjusting time for moving the stop. Therefore, application of this system is limited to microwave in continuous oscillation, for which adjustment is required only one time each before and after the electric discharge, and the system cannot be suitably applied to microwave in pulsed oscillation.

By use of the MW-PCVD apparatus of this system, an A-Si film was formed under the film forming conditions shown in Table 2. As a result, a deposition rate of 12 Å/sec was attained over a $\phi 4''$ wafer, the rate being at least two times that in the conventional system, and a film having a photoconductivity $\delta p = 5.5 \times 10^{-10}$ [$\Omega^{-1}cm^{-1}$], a dark conductivity $\delta d = 9.8 \times 10^{-15}$ [$\Omega^{-1}cm^{-1}$], an optical band gap Egopt=1.8 [eV] and an activation energy Ea=0.84 [eV] was obtained.

APPARATUS EXAMPLE 2

Figure 3:
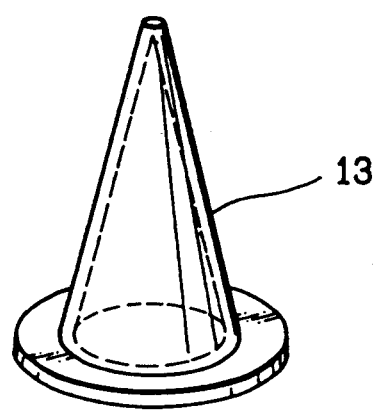
FIG. 3 is a perspective view of a conical bell-jar used in the MW-PCVD apparatus according to this invention.

This example was the same as Apparatus Example 1 except that the circular bell-jar used in Apparatus Example 1 was replaced by a conical bell-jar as shown in FIG. 3. The bell-jar, formed of quartz, had a conical shape with 180 mm height and $\phi 70$ base.

In Apparatus Example 1 above, the reentrant cylindrical cavity resonator is obtained upon generation of electric discharge, and the cylindrical bell-jar used shows much reflection, so that the Q value of the resonator is high, but the microwave energy absorption factor is a little inferior to that in the case of the ECR type. In the present example, however, due to the use of the conical bell-jar, the characteristic impedance of the coaxial portion is gradually varied, and it may be said that a deformed reentrant cavity is formed. Therefore, reflection due to impedance mismatching is obviated, and microwave energy absorption factor is enhanced accordingly.

APPARATUS EXAMPLE 3

Figure 4:
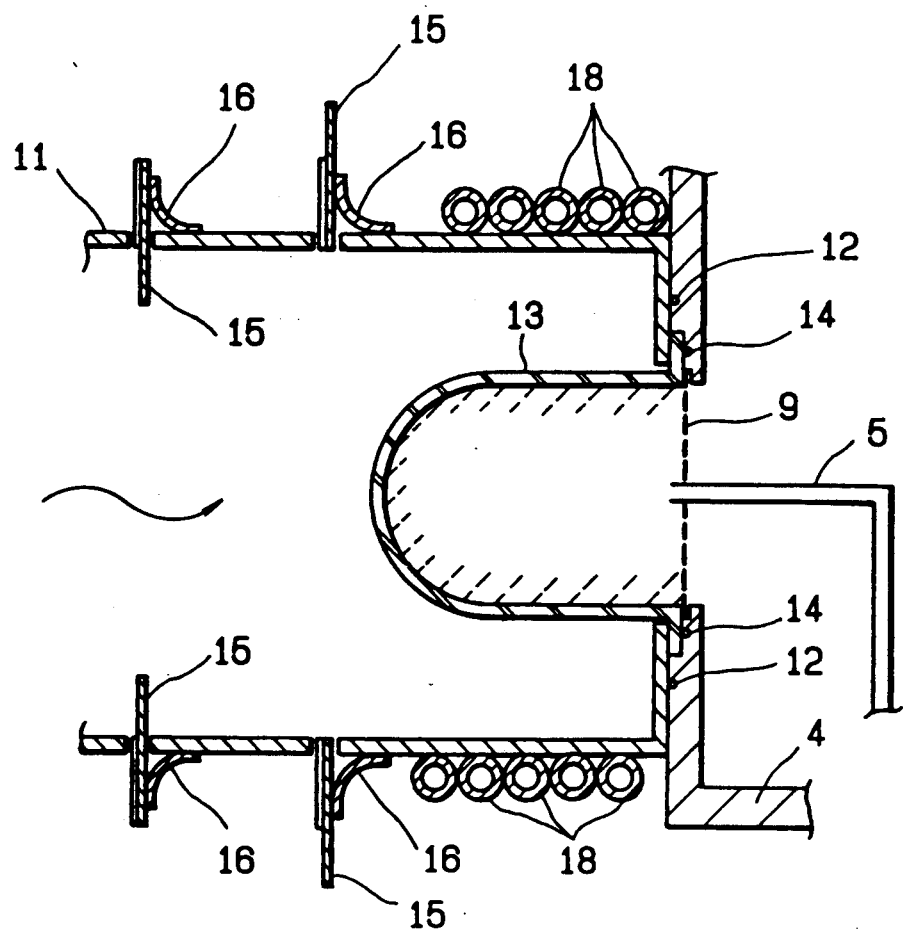
FIG. 4 is a partially sectional schematic illustration of another example of the first MW-PCVD apparatus of this invention.

FIG. 4 is a partially sectional schematic illustration of this apparatus example. In the figure, the elements assigned the same marks as those in FIG. 1 are the same as the corresponding elements in FIG. 1.

As is apparent from FIG. 4, this apparatus example has the same construction as that of Apparatus Example 1 except that two circular stops the same as the circular stop 15 used in Apparatus Example 1 were disposed.

In the case of Apparatus Example 1, the single stop is slidden for initial electric discharge and for the subsequent sustained discharge. Therefore, there is the merit of versatility since it is possible to cope with various kinds of gases, pressures and gas mixing ratios, but there is the demerit that it takes long time for adjustment. In the case of the present apparatus example, on the other hand, there is the merit that it is required only to vary the open area ratio of the aperture of the stops when the kinds of gases, the pressure, the gas mixing ratio, etc. are fixed.

Namely, referring to FIG. 4, initial electric discharge is effected through impedance matching by fully opening the left circular stop, A, and adjusting the aperture diameter of the right circular stop, B. When the initial discharge is brought about, the stop B is fully opened and the stop A is restricted to form a new cavity resonator defined by the stop A, bell-jar 13 and circular waveguide 11. For impedance matching of the new cavity resonator and the plasma-containing system, the open area ratio of the aperture of the stop A is adjusted so as to minimize the reflected power measured by the above-mentioned wattmeter.

APPARATUS EXAMPLE 4

Figure 5:
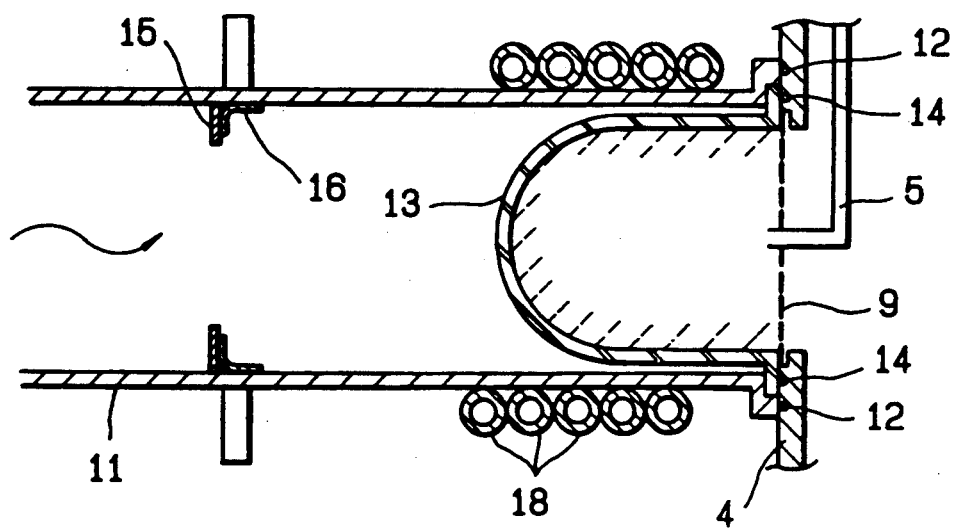
Figure 6:
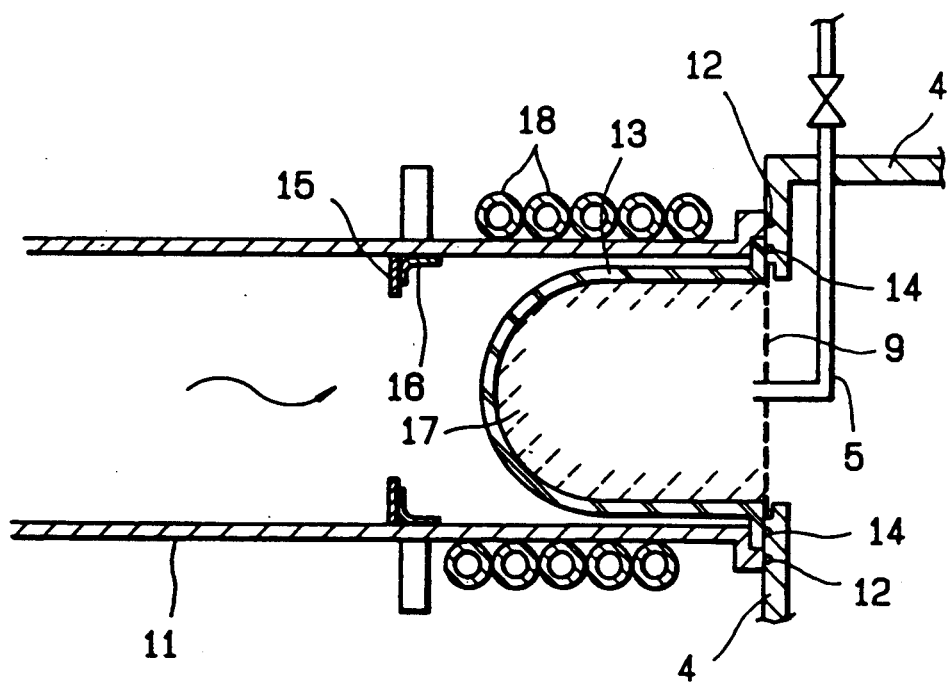

FIGS. 5 and 6 are each a partially sectional schematic illustration of one typical example of the second MW-PCVD apparatus according to this invention, in which FIG. 5 shows the condition before plasma generation, while FIG. 6 shows the condition after the plasma generation.

In the figures, numeral 4 denotes a film forming chamber, or treating chamber, 5 a gas supply pipe, 9 a metal mesh (formed of aluminum), 11 a circular waveguide (formed of aluminum), 12 an E.M.I. (electromagnetic interference) shield ring (formed of copper), 13 a bell-jar (formed of quartz), 14 an Ô-ring, 15 a circular stop (formed of aluminum), 16 a finger type E.M.I. shield ring (formed of copper), 17 a plasma, and 18 denotes a water-cooling pipe (formed of copper).

As is apparent from FIG. 5, in this apparatus example, the circular waveguide 11 is fastened to the treating chamber, and the E.M.I. (electromagnetic interference) shield ring 12 is used for good electrical contact of the two members. The circular bell-jar 13 is fixed in the circular waveguide 11 to internally contact the waveguide 11, and gas tightness is maintained by the Ô-ring 14. The circular bell-jar and the treating chamber 14 are separated from each other by the metal mesh 9, the mesh opening area of which is so selected as to permit penetration of gases therethrough but not to permit transmission of microwave therethrough. The circular waveguide 11 is provided with two slits in the direction of weaker electric field so that the circular stop 15 in the waveguide 11 can be externally driven through the slits. To the circular stop 15, the finger type E.M.I. shield 16 is secured, as shown in FIG. 3, for good electrical contact of the stop 15 and the waveguide 11.

In operation, a microwave oscillator (not shown) is first started to cause microwave to be propagated through a microwave circuit (not shown), thereby effecting excitation in a $^{0}TE_{11m}$ mode (m is an integer). The microwave thus propagated are denoted by an arrow: in FIGS. 5 and 6.

For easy start of electric discharge in FIG. 5, it is sufficient to satisfy the following conditions:

Condition 1: to use a circular waveguide 11 having such an inside diameter D that the microwave are not cut off;

Condition 2: to form a cavity resonator by the circular stop 15 and the metal mesh 9.

Condition 1 is satisfied, according to Eitaro Abe, "MICROWAVE GIJUTSU (Microwave Engineering)", The University of Tokyo Press, by satisfying the following formula (1):

$$D > \frac{1.841}{\pi} \times \lambda_0 \quad (1)$$

where $\lambda_0$ is the wavelength [mm] of microwave in free space.

Condition 2 is satisfied by inserting a commercial microwave wattmeter into the microwave circuit (not shown) between the microwave oscillator (not shown) and the circular waveguide 11 and adjusting the position of the circular stop 15 so that reflected power is substantially zero and transmitted power is maximized.

In general, the microwave of a frequency of 2.45 GHz are used, so that $\lambda_0 = 122.4$ [mm] and Condition 1 is D>71.7 [mm] from the formula (1). Based on experiments, condition 2 is as shown in Table 3.

The experiments were carried out under the conditions of a microwave power of 150 W and a pressure of $1.3 \times 10^{-2}$ Torr by using 30 sccm of $SiF_4$ gas, 150 sccm of Ar gas and 20 sccm of $H_2$ gas.

In FIG. 6, for maintaining electric discharge efficiently, it is sufficient to satisfy the following conditions:

Condition 3: to cut off the microwave by the plasma in the bell-jar 13; and

Condition 4: to form a cavity resonator by the circular stop 15 and the bell-jar 13.

In other words, Condition 3 is $$nD < \frac{1.841}{\pi} \times \lambda_0 (O < n < 1) \quad (2)$$

where the complex index of refraction of the plasma is n-ik (k is absorption coefficient). Since the value of n depends on the density of the plasma, the condition can be controlled by the degree of vacuum and microwave power.

When the formula (2) is satisfied, the microwave in FIG. 6 are cut off in the vicinity of the bell-jar 13, a portion of the microwave is absorbed by the plasma, and a major portion is reflected. Therefore, Condition 4 is satisfied by adjusting the position of the circular stop 15 in the same manner as for Condition 2, thereby reciprocating the microwave repeatedly, forming a new cavity resonator defined by the bell-jar 13 and the circular stop 15, and accumulating the electric field energy in that space. It was found that when the electric field energy of the microwave is accumulated in the cavity resonator, it is possible to reduce reflected waves and to equivalently increase the number of times of contact of the microwave with the plasma, thereby generating radicals efficiently.

From Table 3, the length of the cavity resonator before electric discharge and that after the electric discharge are as shown in Table 4.

After Table 4 illustrates, the cavity resonator after the electric discharge is quite small. This fact is due to the phase delay $\delta$ of the reflected wave from the plasma, and the $\delta$ is a function of the absorption coefficient k of the plasma. Therefore, the length of the cavity resonator after the electric discharge varies depending on the discharge conditions (microwave power, the kinds of gases, pressure, etc.)

Namely, this system can be realized by satisfying Conditions 1 and 2 before electric discharge and satisfying Conditions 3 and 4 after the electric discharge.

However, impedance matching before and after the electric discharge requires an adjusting time for moving the stop. Therefore, application of this system is limited to microwave in continuous oscillation, for which adjustment is required only one time each before and after the electric discharge, and the system cannot be suitably applied to microwave in pulsed oscillation.

By use of the MW-PCVD apparatus of this system, an A-Si film was formed under the film forming conditions shown in Table 5.

As a result, a deposition rate of 15 Å/sec was attained, the rate being about three times that in the conventional system, and a film having a photoconductivity $\delta p = 1 \times 10^{-8}$ [$\Omega^{-1}cm^{-1}$], a dark conductivity $\delta d = 1.4 \times 10^{-13}$ [$\Omega^{-1}cm^{-1}$], an optical band gap Egopt=1.9 [eV] and an activation energy Ea=0.99 [eV] was obtained.

APPARATUS EXAMPLE 5

Figure 7:
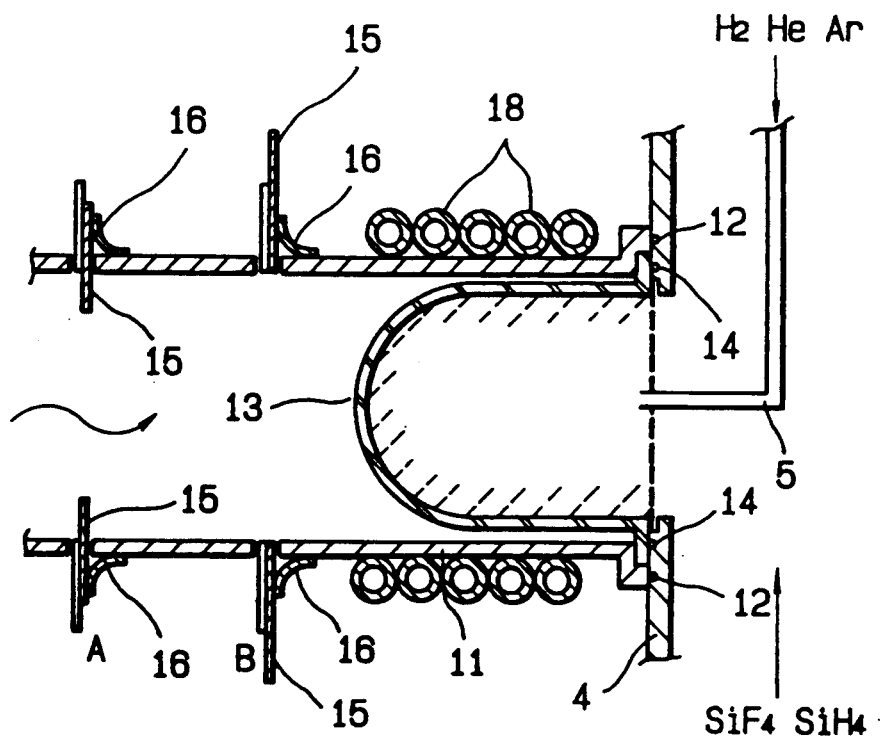
FIG. 7 is a partially sectional schematic illustration of another example of the second MW-PCVD apparatus of this invention.

FIG. 7 is a partially sectional schematic illustration of this apparatus example. In the figure, the elements assigned the same marks as those in FIG. 5 are the same as the corresponding elements in FIG. 5.

As is apparent from FIG. 7, this apparatus example has the same construction as that of Apparatus Example 4 except that two circular stops the same as the circular stop 15 used in Apparatus Example 1 were disposed.

In the case of Apparatus Example 4, the single stop is slidden for initial electric discharge and for the subsequent sustained discharge. Therefore, there is the merit of versatility since it is possible to cope with various kinds of gases, pressures and gas mixing ratios, but there is the demerit that it takes long time for adjustment. In the case of the present apparatus example, on the other hand, there is the merit that it is required only to vary the open area ratio of the aperture of the stops when the kinds of gases, the pressure, the gas mixiing ratio, etc. are fixed.

Namely, referring to FIG. 7, initial electric discharge is effected through impedance matching by fully opening the left circular stop, A, and adjusting the aperture diameter of the right circular stop, B. When the initial discharge is brought about, the stop B is fully opened and the stop A is restricted to form a new cavity resonator defined by the stop A, bell-jar 13 and circular waveguide 11. For impedance matching of the new cavity resonator and the plasma-containing system, the open area ratio of the aperture of the stop A is adjusted so as to minimize the reflected power measured by the above-mentioned wattmeter.

Figure 8:
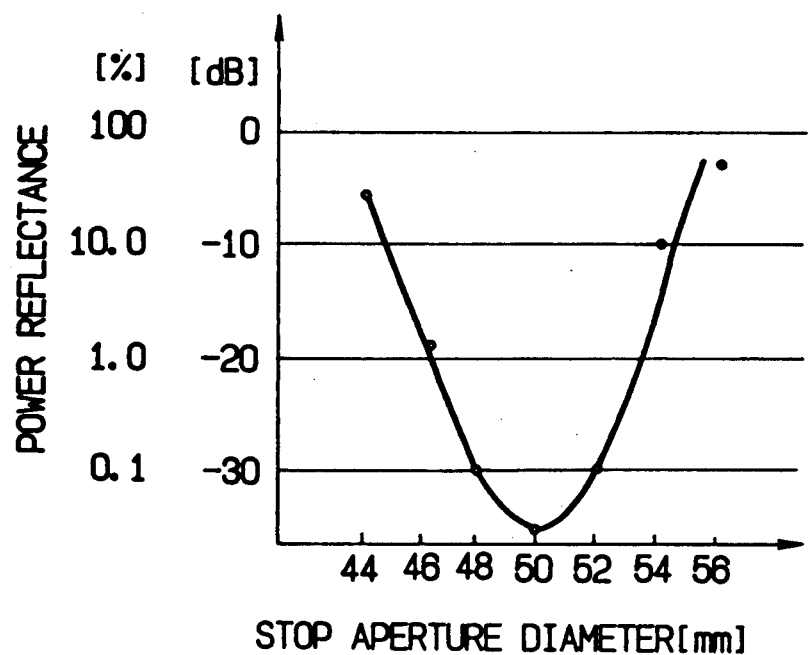
FIG. 8 is a diagram showing the relationship between the open area ratio of the aperture of a stop B and power reflectance.
Figure 9:
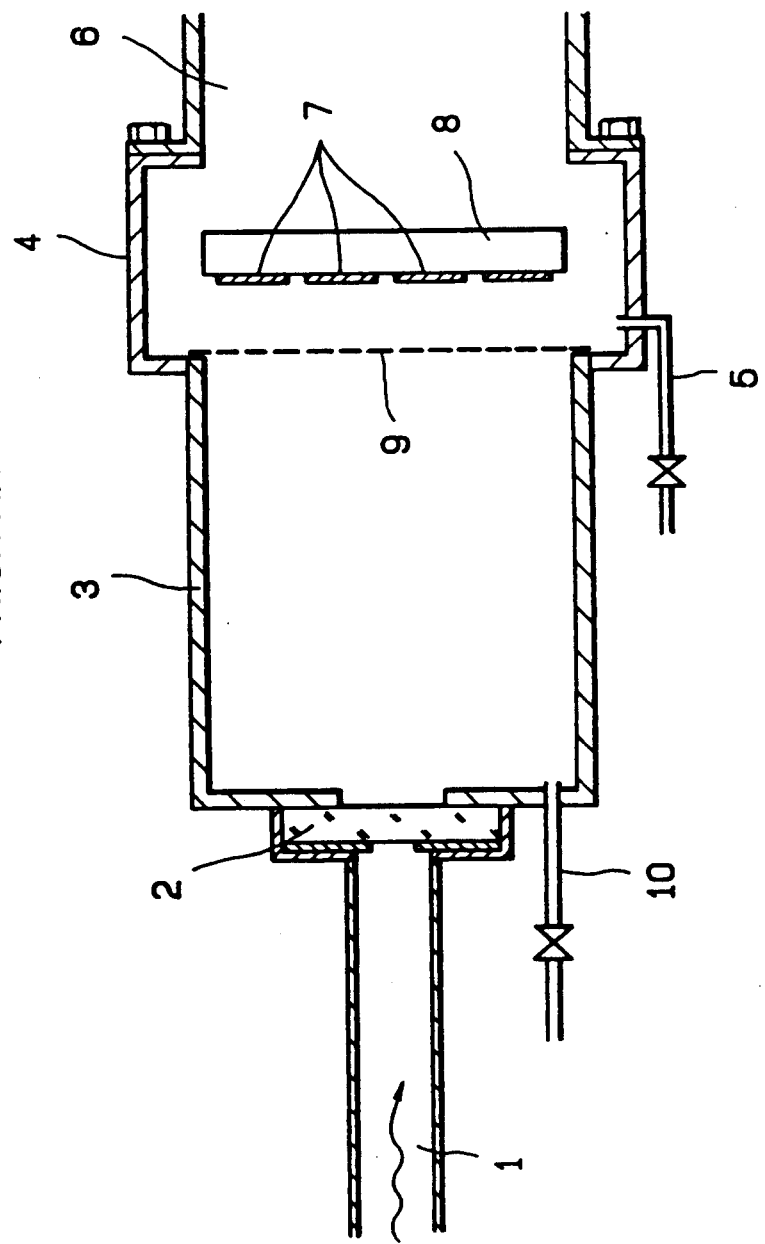
FIG. 9 is a sectional schematic illustration of a conventional MW-PCVD apparatus.

An example of the adjustment after the electric discharge is shown in FIG. 8, in which the abscissa represents the open area ratio of the aperture of the stop B, and the ordinate represents the above-mentioned reflected power. The discharge conditions are as shown in Table 6.

As is clear from FIG. 8, for a stop aperture diameter in the range of $\phi 46$ to $\phi 53$, the microwave reflectance is not more than 1%. In this case, therefore, it suffices to adjust the stop aperture diameter to within the allowable range of $\pm \phi 3.5$. It is generally difficult to continuously vary the aperture diameter of a circular stop, and, accordingly, a 5-vane stop or a polygonal stop may be used in place of the circular stop.

The description of this apparatus example has been limited to the system comprising a circular waveguide, a cylindrical bell-jar internally contacting the waveguide, and a circular stop. However, a similar result is obtained with a system comprising a rectangular waveguide, a rectangular bell-jar internally contacting the waveguide, and an angular stop.

TABLE 1

| | Distances L and L' from metal mesh to circular stop before and after electric discharge | | | | | | |
|---|---|---|---|---|---|---|---|
| | Inside | | | Before discharge | | After discharge | |
| | diameter of circular waveguide D | Propagation mode | Size of bell-jar | Aperture diameter of stop | L (mm) | Aperture diameter of stop | L' (mm) |
| Example 1 | $\phi$ 120 | T E$_{113}$ | $\phi$ 70 × 180 | $\phi$ 70 ± 3 | 220 | $\phi$ 75 ± 3 | 200 |

TABLE 2

| Raw material gas | Flow rate (sccm) | Microwave power (W) | Pressure (Torr) | Substrate temperature (°C.) | Metal mesh (punched aluminum board) | |
|---|---|---|---|---|---|---|
| SiF$_4$ | 100 | 500 | $8 \times 10^{-2}$ | 200 | $\phi$ 6 mm | t 0.8 mm |
| H$_2$ | 50 | | | | open area ration: 40% | |
| Ar | 200 | | | | microwave transmittance: 0.2% | |

TABLE 3

| | Distances L and L' from metal mesh to circular stop before and after electric discharge | | | | | | |
|---|---|---|---|---|---|---|---|
| | Inside | | | Before discharge | | After discharge | |
| | diameter of circular waveguide D | Propagation mode | Size of bell-jar | Aperture diameter of stop | L (mm) | Aperture diameter of stop | L' (mm) |
| Example 4-1 | $\phi$ 80 | T E$_{112}$ | $\phi$ 70 × 100 | $\phi$ 50 | 213 ± 3 | $\phi$ 50 | 200 ± 3 |
| Example 4-2 | $\phi$ 98 | T E$_{113}$ | $\phi$ 70 × 100 | $\phi$ 52 | 210 ± 3 | $\phi$ 52 | 198 ± 3 |

TABLE 4

| Length of cavity resonator before and after electric discharge (mm) | | |
|---|---|---|
| | Before discharge | After discharge |
| Example 4-1 | 213 | 135 |
| Example 4-2 | 210 | 133 |

TABLE 5

| Raw material gas | Flow rate (sccm) | Microwave power (W) | Pressure (Torr) | Substrate temperature (°C.) | Metal mesh (punched aluminum board) |
|---|---|---|---|---|---|
| SiF$_4$ | 100 | 400 | $2 \times 10^{-2}$ | 250 | $\phi$ 6 mm    t 0.8 mm |
| H$_2$ | 100 | | | | open area ration: 40% |
| Ar | 200 | | | | microwave transmittance: 0.2% |

TABLE 6

| Discharge conditions in the case shown in FIG. 8 | | | |
|---|---|---|---|
| Raw material gas | Flow rate (sccm) | Microwave power (W) | Pressure (Torr) |
| H$_2$ | 20 | 200 | $8 \times 10^{-3}$ |
| Ar | 200 | | |

What we claim is:

1. In a microwave plasma CVD apparatus comprising a treating chamber having means for supporting a body to be treated therein, a plasma generating chamber connected to the treating chamber through a metal mesh, means for introducing a gas into the plasma generating chamber, and means for introducing microwave to convert the gas in the plasma generating chamber into a plasma, the improvement comprising: (a) means for maintaining the microwaves in continuous oscillation, (b) the plasma generating chamber constituteing a cylindrical cavity resonator defined by the metal mesh and a stop or stops, and (c) a bell-jar (i) smaller than the cavity in the axial length and (ii) smaller than the inside diameter of said cavity being disposed in the cylindrical cavity resonator in contact with the metal mesh, thereby constituting a reentrant cylindrical cavity resonator through generation of electric discharge in the bell-jar;

the single stop is disposed slidably along the cylindrical cavity or, alternatively, a plurality of the stops are disposed, the aperture of the stop is circular, 5-vane or polygonal, and the open area ratio of the aperture is variable.

2. The microwave plasma CVD apparatus as set forth in claim 1, wherein the bell-jar is cylindrical.

3. The microwave plasma CVD apparatus as set forth in claim 1, wherein the bell-jar is conical.

4. In a microwave plasma CVD apparatus comprising a treating chamber having means for supporting a body to be treated therein, a plasma generating chamber connected to the treating chamber through a metal mesh, means for introducing a gas into the plasma generating chamber, and means for introducing microwave to convert the gas in the plasma generating chamber into a plasma, the improvement comprising: (a) means for maintaining the microwaves in continuous oscillation, (b) the plasma generating chamber constituting a cavity surrounded by the metal mesh and a stop or stops, (c) a bell-jar internally contacting the cavity being disposed in contact with the metal mesh, and (d) means for controlling the position of the stop according to the condition of electric discharge generated in the bell-jar;

the open area ratio of the aperture of the stop is also controllable.

5. The microwave plasma CVD apparatus as set forth in the claim 4, wherein the cavity is cylindrical, the microwaves are oscillated in a propagation mode of $^0TE_{11m}$ (m is an integer) under such a condition as to satisfy the following formula:

$$nD < \frac{1.841}{\pi} \times \lambda_0 < D \qquad [1]$$

where D is the inside diameter of the cavity, $\lambda_0$ is the oscillation wavelength of the microwaves, and the complex index of refraction of the plasma is n-ik (0>n>1), and the stop is circular, 5-vane or polygonal.

6. The microwave plasma CVD apparatus as set forth in claim 4, wherein the cavity is rectangular, and the stop is tetragonal.

7. The microwave plasma CVD apparatus as set forth in any one of claims 5 and 6, wherein the single stop is disposed slidably along the cavity or, alternatively, a plurality of the stops are disposed.

8. In a microwave plasma CVD apparatus comprising a treating chamber having means for supporting a body to be treated therein, a plasma generating chamber connected to the treating chamber through a metal mesh, means for introducing a gas into the plasma generating chamber, and means for introducing microwave to convert the gas in the plasma generating chamber into a plasma, the improvement comprising: (a) means for maintaining the microwaves in continuous oscillation, (b) the plasma generating chamber constituting a cavity surrounded by the metal mesh and a stop or stops, (c) a bell-jar internally contacting the cavity being disposed in contact with the metal mesh, and (d) means for controlling the position of the stop according to the condition of electric discharge generated in the bell-jar;

the single stop is disposed slidably along the cavity or, alternatively, a plurality of the stops are disposed.

* * * * *

UNITED STATES PATENT AND TRADEMARK OFFICE
CERTIFICATE OF CORRECTION

PATENT NO. : 5,010,276

DATED : April 23, 1991

INVENTOR(S) : HIROSHI ECHIZEN, ET AL.

It is certified that error appears in the above-identified patent and that said Letters Patent is hereby corrected as shown below:

ON THE TITLE PAGE,
IN [56] REFERENCES CITED

Attorney, Agent, or Firm: "Fitzpatrick, Cella Harper & Scinto" should read --Fitzpatrick, Cella, Harper & Scinto--.

COLUMN 5

Line 53, "are used" should read --is used--.

COLUMN 11

Line 28, "constituteing" should read --constitutes--.

COLUMN 12

Line 18, "the" (first occurrence) should be deleted.
    Line 26, "D" should read --D (mm)-- and "$\lambda_0$" should read --$\lambda_0$ (mm)--.

Signed and Sealed this

Eighth Day of December, 1992

Attest:

DOUGLAS B. COMER

Attesting Officer      Acting Commissioner of Patents and Trademarks